(12) United States Patent
Liu et al.

(10) Patent No.: US 12,126,332 B2
(45) Date of Patent: Oct. 22, 2024

(54) CIRCUIT STRUCTURE FOR REALIZING CIRCUIT PIN MULTIPLEXING

(71) Applicant: CRM ICBG (WUXI) CO., LTD., Jiangsu (CN)

(72) Inventors: Weizhong Liu, Jiangsu (CN); Yaping Jiang, Jiangsu (CN)

(73) Assignee: CRM ICBG (WUXI) CO., LTD., Jiangsu (CN)

( * ) Notice: Subject to any disclaimer, the term of this patent is extended or adjusted under 35 U.S.C. 154(b) by 0 days.

(21) Appl. No.: 17/915,095

(22) PCT Filed: Jul. 2, 2021

(86) PCT No.: PCT/CN2021/104255
§ 371 (c)(1),
(2) Date: Sep. 27, 2022

(87) PCT Pub. No.: WO2022/105247
PCT Pub. Date: May 27, 2022

(65) Prior Publication Data
US 2023/0291400 A1   Sep. 14, 2023

(30) Foreign Application Priority Data

Nov. 20, 2020  (CN) .......................... 202011308009.0

(51) Int. Cl.
*H03K 17/22*   (2006.01)
*G01R 19/165*  (2006.01)
(Continued)

(52) U.S. Cl.
CPC ....... *H03K 17/22* (2013.01); *G01R 19/16566* (2013.01); *G05F 1/569* (2013.01);
(Continued)

(58) Field of Classification Search
CPC ...... H03K 17/22; H03K 17/223; H03K 17/62; H03K 17/693; H03K 19/0175;
(Continued)

(56) References Cited

U.S. PATENT DOCUMENTS

| 6,556,496 B2* | 4/2003 | Benedix ................ G11C 11/406 |
| | | 365/222 |
| 2007/0090848 A1 | 4/2007 | Tumin et al. |
| 2018/0159311 A1* | 6/2018 | Guziak .................. H01H 37/32 |

FOREIGN PATENT DOCUMENTS

| CN | 202815628 U | 3/2013 |
| CN | 103066985 A | 4/2013 |

(Continued)

*Primary Examiner* — Long Nguyen
(74) *Attorney, Agent, or Firm* — Global IP Services; Tianhua Gu

(57) ABSTRACT

A circuit structure for realizing circuit pin multiplexing, comprising an MCU module, a temperature sensing circuit and a functional module circuit. The output end of the temperature sensing circuit is connected with an enable signal interface of the MCU module, the output voltage of the temperature sensing circuit is always higher than the threshold voltage of the enable signal, and the MCU module is connected with the functional module circuit. The circuit structure of the present invention realizes the mutual influence of analog signal output and digital signal transmission by designing a temperature sensing output curve, and achieves multi-function multiplexing of a single pin, so that the output of the analog signal and the input of the digital signal can share the pins, it solves the problem of the limitation of the number of pins, and promotes the transmission of the signal and improves the cost performance of the circuit.

11 Claims, 5 Drawing Sheets

(51) Int. Cl.
*G05F 1/569* (2006.01)
*H03K 17/082* (2006.01)
*H03K 19/0175* (2006.01)
*H03K 19/173* (2006.01)

(52) U.S. Cl.
CPC ..... *H03K 17/0822* (2013.01); *H03K 19/0175* (2013.01); *H03K 19/1732* (2013.01)

(58) Field of Classification Search
CPC ............. H03K 19/173; H03K 19/1731; H03K 19/1732; H03K 19/1733; H03K 19/1737; G01R 19/165; G01R 19/16566; G01R 19/16576
See application file for complete search history.

(56) References Cited

FOREIGN PATENT DOCUMENTS

| | | |
|---|---|---|
| CN | 104568194 A | 4/2015 |
| CN | 206146549 U | 5/2017 |

* cited by examiner

CIRCUIT STRUCTURE FOR REALIZING CIRCUIT PIN MULTIPLEXING

CROSS REFERENCE TO RELATED PATENT APPLICATION

The present application is the US national stage of PCT/CN2021/104255 filed on 2021 Jul. 2, which claims the priority of the Chinese patent application No. 202011308009.0 filed on 2020 Nov. 20, which application is incorporated herein by reference.

FIELD OF TECHNOLOGY

The present invention relates to the field of circuit design, in particular to the field of signal transmission, and specifically to a circuit structure for realizing circuit pin multiplexing.

BACKGROUND

With the continuous advancement and improvement of technology, circuits are carrying more and more functions, and the required interfaces in the circuits are also increasing accordingly. In the case of limited package pins, pin multiplexing is used to solve the problem of the signal transmission. In some power-drive circuits, due to the high power consumption, it is necessary to continuously monitor the temperature of the circuit to adjust the working state of the circuit, thereby preventing the circuit from being damaged caused by high temperature. FIG. 1 shows a curve of voltage outputted by a temperature sensing circuit inside the circuit, where the voltage is proportional to the temperature. FIG. 2 shows a corresponding application scenario.

In FIG. 1, the output voltage has a linear relationship with the temperature, and different temperatures of chips proportionally correspond to different voltage values. Therefore, by reading the voltage value output by the temperature sensing circuit inside the circuit, the temperature of the chip inside the circuit can be calculated.

In FIG. 2, the MCU (Microcontroller Unit) detects the output of the temperature sensing signal to determine the working state of the circuit. When the temperature is high, the working state of the circuit will be changed to reduce the power consumption, thereby reducing the temperature of the circuit and reducing the possibility of circuit damage. At the same time, the MCU will also accept or detect other working states. Once an abnormality occurs, the MCU will send an enable signal (EN) to a subsequent circuit to interrupt the work of the circuit, or restart the work after the state becomes normal. FIG. 3 shows the conventional transmission of the enable signal in the circuit.

FIG. 2 is a schematic diagram of an internal structure. When the external input signal EN reaches a low level (lower than a threshold voltage Vth), the internal signal Y is inverted, thereby controlling the internal circuit to perform corresponding actions. The actual internal structure may include an inverter, a Schmitt trigger, a comparator or a multi-input gate circuit, etc., while no matter which form is, a threshold voltage Vth is required. When the EN voltage reaches to Vth, it is considered that the EN is valid and the corresponding action is performed.

SUMMARY

The present invention provides a circuit structure for realizing circuit pin multiplexing, which has the advantages of simple structure, solving the limitation of the number of pins, and wide application range.

The circuit structure for realizing circuit pin multiplexing of the present invention is as follows:

The circuit structure for realizing circuit pin multiplexing includes an MCU module, a temperature sensing circuit and a functional module circuit. The output end of the temperature sensing circuit is connected with an enable signal interface of the MCU module, the output voltage of the temperature sensing circuit is always higher than the threshold voltage of the enable signal, and the MCU module is connected with the functional module circuit.

In an embodiment, the MCU module outputs a low-level signal, and transmits the low-level signal to the temperature sensing circuit.

In an embodiment, the circuit structure further includes an overcurrent-protection circuit and a temperature-protection circuit, and the overcurrent-protection circuit and the temperature-protection circuit are both connected with the output end of the temperature sensing circuit, and the outputs of the overcurrent-protection circuit and the temperature-protection circuit are both set to be open-drain output mode.

In an embodiment, the temperature sensing circuit includes a reference circuit unit, an inverting amplifier circuit and a follower circuit, where the reference circuit unit outputs a reference voltage Vf1 signal and a reference voltage Vf2 signal, respectively.

The forward end of the inverting amplifier circuit is connected with the reference circuit unit, and the input of the forward end is the reference voltage Vf1; the reverse input signal of the inverting amplifier circuit is Vpn, and the output signal of the inverting amplifier circuit is Vot.

The forward end of the follower circuit is connected with the reference circuit unit, and the input of the forward end is the reference voltage Vf2; the reverse end of the follower circuit is connected with the reference circuit unit.

The temperature sensing circuit also includes a current source and a diode, the negative direction of the diode is grounded, the positive direction is connected with the current source, and the other end of the current source is grounded. The current source generates voltage Vpn with a negative temperature characteristic through the diode, and the voltage Vpn is input to the reverse end of the inverting amplifier circuit.

In an embodiment, the inverting amplifier circuit includes a first operational amplifier, a first resistor, a second resistor, a third resistor and a current limiting resistor, the forward end of the first operational amplifier is connected with an end of the first resistor, and the third resistor is set between the reverse end and the output end of the first operational amplifier, and the other end of the first resistor is connected with the reference circuit, the output end of the first operational amplifier is connected with the current limiting resistor, and the second resistor is respectively connected with the reverse end of the first operational amplifier and the follower circuit.

In an embodiment, the follower circuit includes a second operational amplifier and a MOS (Metal Oxide Semiconductor) transistor, the forward end of the second operational amplifier is connected with the reference circuit unit, the reverse end of the second operational amplifier is connected with the second resistor, and the gate of the MOS transistor is connected with the output end of the second operational amplifier, the source and the drain are respectively connected with both sides of the diode.

The circuit structure for realizing circuit pin multiplexing of the present invention realizes the mutual influence of analog signal output and digital signal transmission by designing a temperature sensing output curve, and achieves multi-function multiplexing of a single pin, so that the output of the analog signal and the input of the digital signal can share the pins, which not only solves the problem of the limitation of the number of pins, but also effectively promotes the transmission of the signal and improves the cost performance of the circuit.

DETAILED DESCRIPTION

In order to describe the technical content of the present invention more clearly, further description will be given below with reference to specific embodiments.

Since traditional integrated circuits carry too many functions, the number of circuit pins in miniaturized packaged integrated circuits limits the extension of functions, therefore, pin multiplexing is used to solve the problem. The present invention combines the output of an analog signal and the input of a digital signal to realize the multiplexing of pins and avoid the limitation of the extension of circuit functions due to the number of pins.

The circuit structure involved in the present invention realizes the mutual influence of analog signal output and digital signal transmission, outputs temperature sensing output curve, and achieves the multifunctional multiplexing of a single pin.

Figure 5:
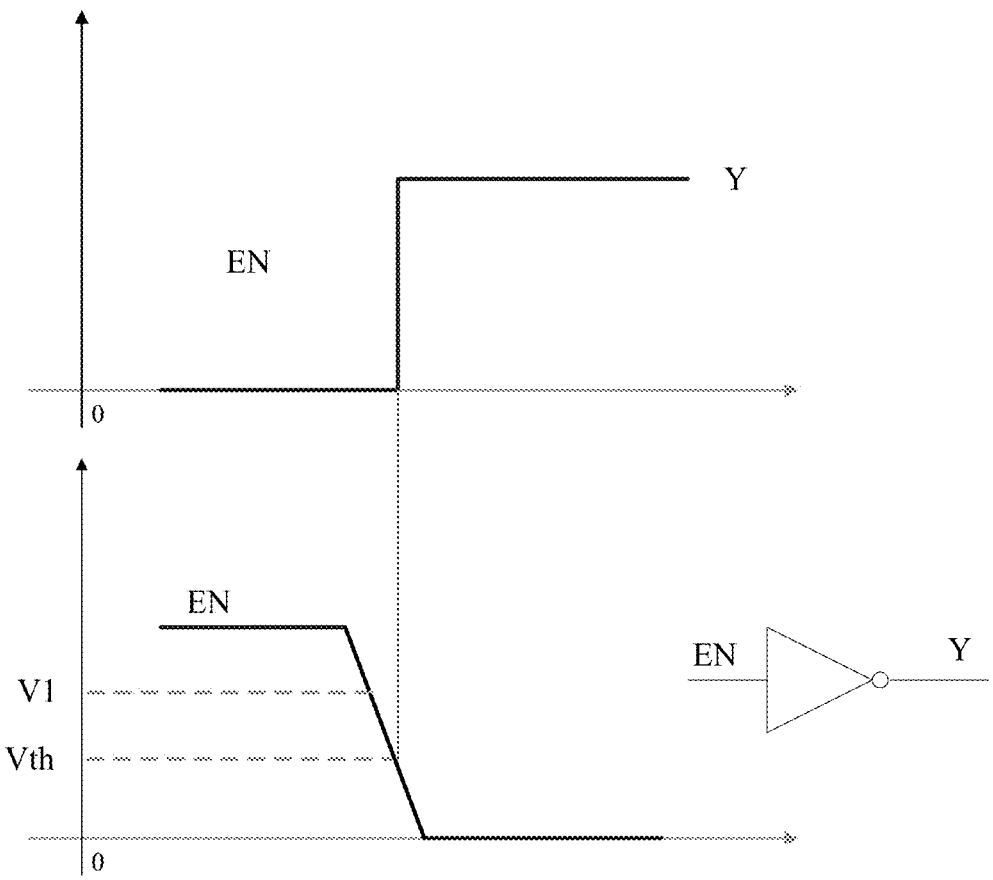
FIG. 5 is a diagram of V1 voltage curve when the temperature of the circuit structure for realizing circuit pin multiplexing according to the present invention reaches to T1.

Usually the temperature of the chip inside the circuit can be inferred by reading the output voltage of the temperature sensing module in the circuit. In actual use, since high temperature will cause damage to the circuit and other safety problems, high temperature areas in the circuit are mainly tested, and low temperature areas are not tested. As shown in FIG. 5, the circuit structure of the present invention allows the output voltage to reduce to VI and then do not continue to reduce, and controls the threshold voltage Vth of the input signal below the VI voltage to realize pin multiplexing with two functions.

Figure 6:
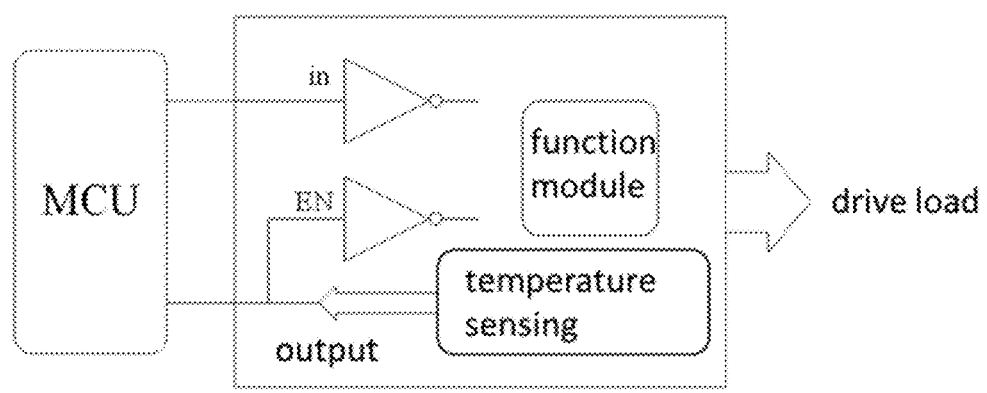
FIG. 6 is a schematic diagram of a pin multiplexing circuit of the circuit structure for realizing circuit pin multiplexing according to the present invention.

The circuit structure for realizing circuit pin multiplexing of the present invention, as shown in FIG. 6, includes an MCU module, a temperature sensing circuit and a functional module circuit, where the output end of the temperature sensing circuit is connected with an enable signal interface of the MCU module, the MCU module is connected with the functional module circuit, the output voltage of the temperature sensing circuit is always higher than a threshold voltage of the enable signal, and the MCU outputs a low-level signal and transmits the low-level signal to the temperature sensing circuit.

When the MCU normally detects the output voltage of the temperature sensing circuit, the output voltage is always higher than the threshold voltage of the enable signal, therefore, an erroneous enable signal will not be generated. When necessary, the MCU allows the enable signal to reach a low level and transmits the enable signal to the inside of the circuit. At this time, the low level will not be mistakenly identified as a high temperature state.

Figure 7:
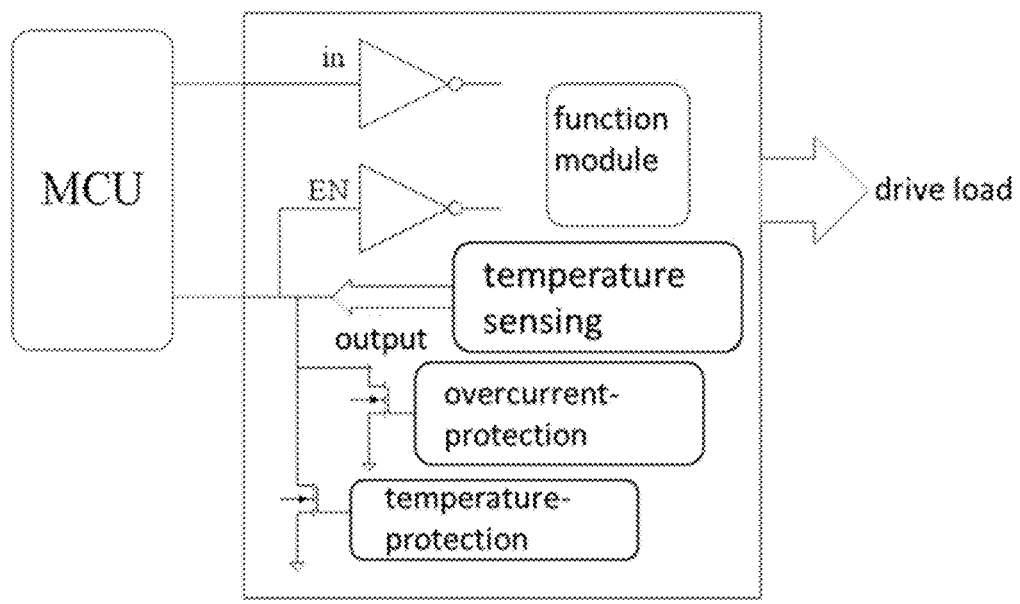
FIG. 7 is a schematic diagram of a pin multiplexing circuit of an embodiment of the circuit structure for realizing circuit pin multiplexing according to the present invention.
Figure 8:
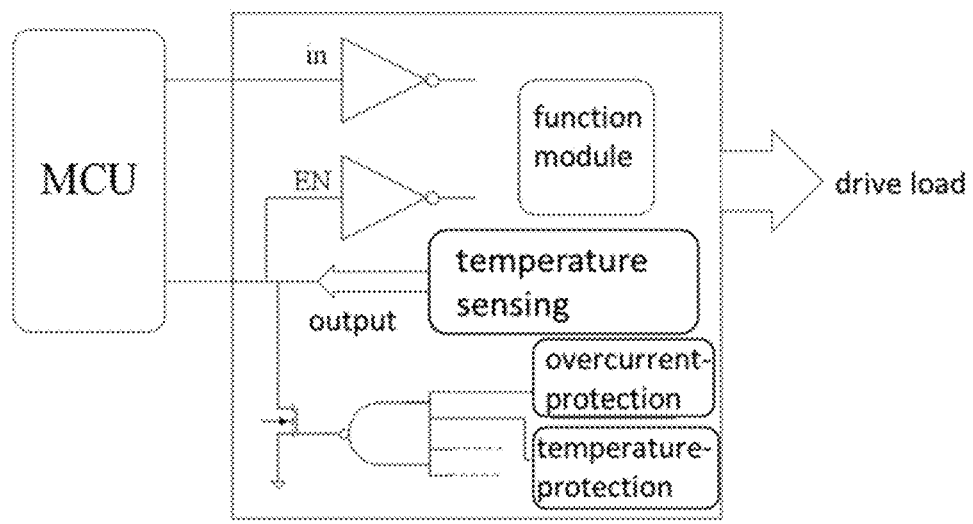
FIG. 8 is a schematic diagram of a pin multiplexing circuit of another embodiment of the circuit structure for realizing circuit pin multiplexing according to the present invention.

As shown in FIG. 7, the circuit structure also includes an overcurrent-protection circuit and a temperature-protection circuit, where both of the two circuits are connected with the output end of the temperature sensing circuit, and the outputs of the overcurrent-protection circuit and the temperature-protection circuit are both set to be open-drain output mode. Connecting the outputs of other protection functions to the same output end of the temperature sensing circuit, and setting the outputs of the overcurrent-protection circuit and the temperature-protection circuit to be open-drain output mode, therefore, the functions will not affect each other, and the effect of pin multiplexing is achieved.

The temperature sensing circuit of the present invention includes a reference circuit unit, an inverting amplifier circuit and a follower circuit. The reference circuit unit outputs a reference voltage Vf1 signal and a reference voltage Vf2 signal respectively; the forward end of the inverting amplifier circuit is connected with the reference circuit unit, and the input of the forward end is the reference voltage Vf1; the reverse input signal of the inverting amplifier circuit is Vpn; the output signal of the inverting amplifier circuit is Vot; the forward end of the follower circuit is connected with the reference circuit unit, and the input of the forward end is the reference voltage Vf2; the reverse end of the follower circuit is connected with the reference circuit unit. The temperature sensing circuit also includes a current source If1 and a diode, the negative direction of the diode is grounded, and the positive direction is connected with the current source If1, the other end of the current source If1 is grounded, the current source If1 generates voltage Vpn with a negative temperature characteristic through the diode, and the voltage Vpn is input to the reverse end of the inverting amplifier circuit.

The inverting amplifier circuit includes a first operational amplifier AMP1, a first resistor R1, a second resistor R2, a third resistor Rf and a current limiting resistor. The forward end of the first operational amplifier AMP1 is connected with the first resistor R1, and the third resistor is set between the reverse end and the output end of the first operational amplifier AMP1; the other end of the first resistor R1 is connected with the reference circuit; the output end of the first operational amplifier AMP1 is connected with the current limiting resistor, and the second resistor R2 is respectively connected with the reverse end of the first operational amplifier AMP1 and the follower circuit.

The input of the forward end of the inverting amplifier circuit is the reference voltage Vf1, the reverse input signal of the inverting amplifier circuit is Vpn. $R_t$ represents the current limiting resistor, and Vf1 and Vf2 are both generated by the reference circuit. In an embodiment, the stable current source If1 generates voltage Vpn with a negative temperature characteristic through the diodes D1 and D2, or through a single diode, and inputs the voltage Vpn to the second resistor R2.

The follower circuit includes a second operational amplifier AMP2 and a MOS transistor P1. The forward end of the second operational amplifier AMP2 is connected with the reference circuit unit, and the reverse end is connected with the second resistor R2; the gate of the MOS transistor P1 is connected with the output end of the second operational amplifier AMP2, the source and the drain are respectively connected with both sides of the diodes.

Figure 9:
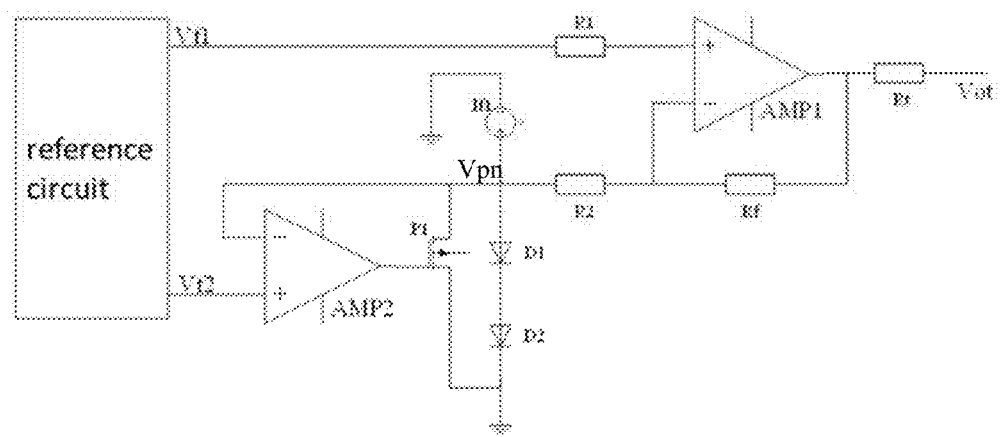
FIG. 9 is a schematic structural diagram of a temperature sensing output circuit of the circuit structure for realizing circuit pin multiplexing according to the present invention.

As shown in FIG. 9, due to the action of the reference voltage Vf2, the maximum value of the reverse input signal Vpn is clamped, that is, Vpn≤Vf2.

The value of Vot can be expressed as:

$$Vot=-Rf/R2\times Vpn+(Rf/R2+1)Vf1$$

where (Rf/R2+1) Vf1 is a fixed value. Since Vpn has a negative temperature characteristic, Vot shows a positive temperature characteristic.

Since the maximum value of the reverse input signal Vpn is limited by the clamping action of the follower, Vpn,max=Vf2, the minimum value of Vot is expressed as:

$$Vot,min=-Rf/R2\times Vf2+(Rf/R2+1)Vf1.$$

Figure 1:
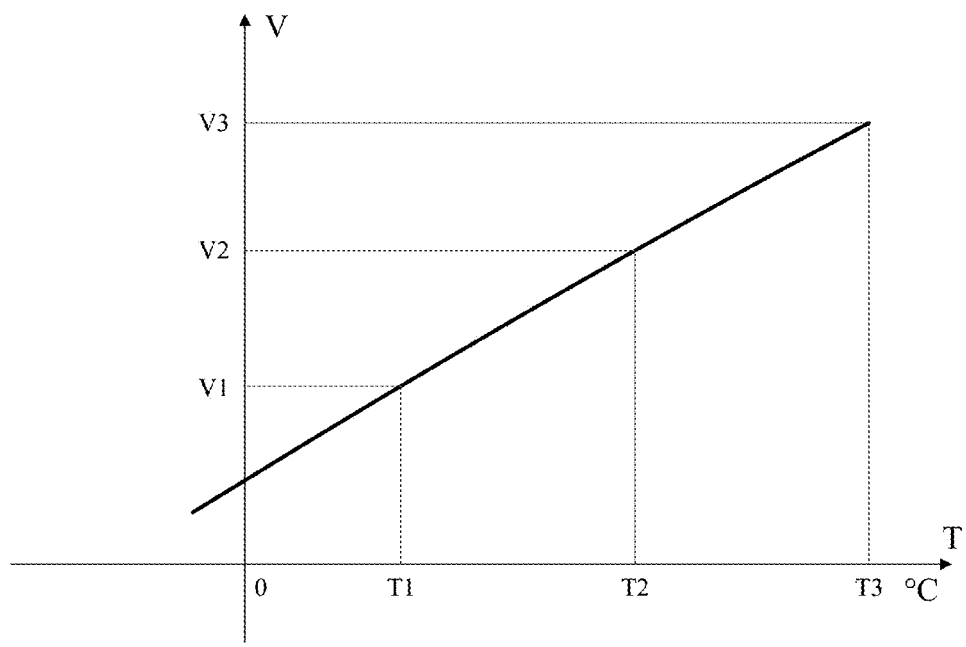
FIG. 1 is a schematic diagram of a voltage curve proportional to temperature output by a temperature sensing circuit in the prior art.
Figure 2:
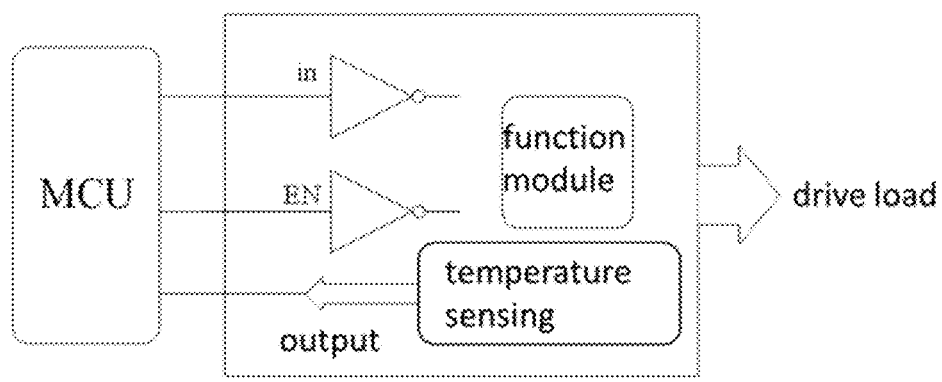
FIG. 2 is a schematic diagram of a circuit structure in an application scenario of the voltage curve in the prior art.
Figure 3:
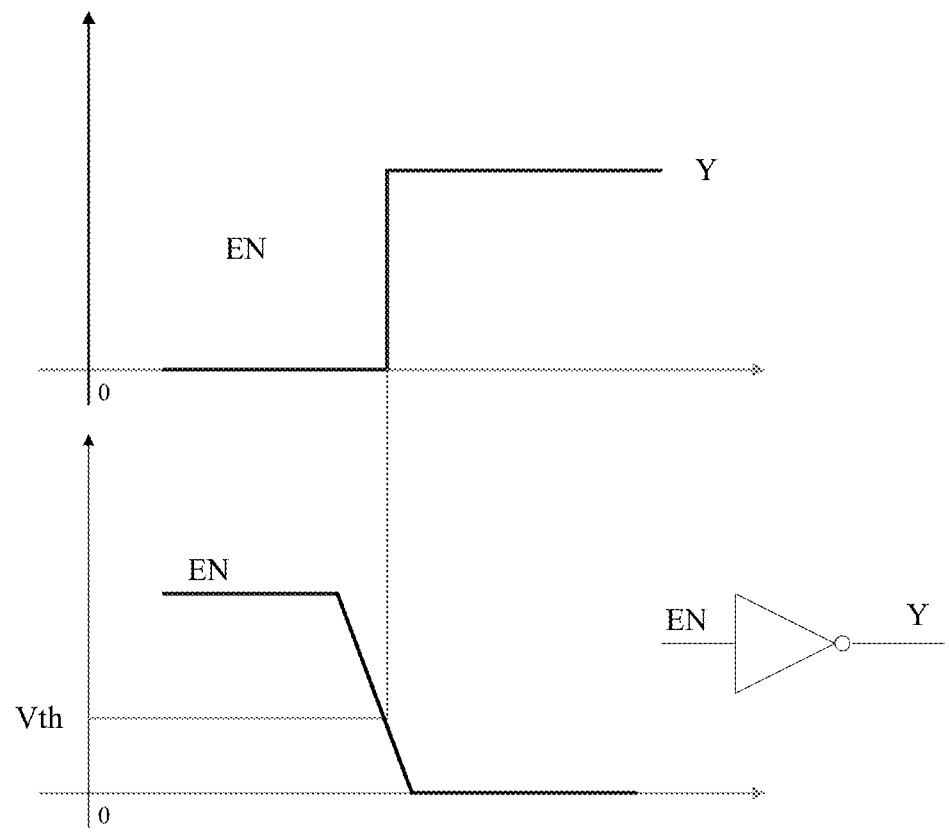
FIG. 3 is a schematic diagram of a conventional transmission manner of an enable signal in a circuit in the prior art.
Figure 4:
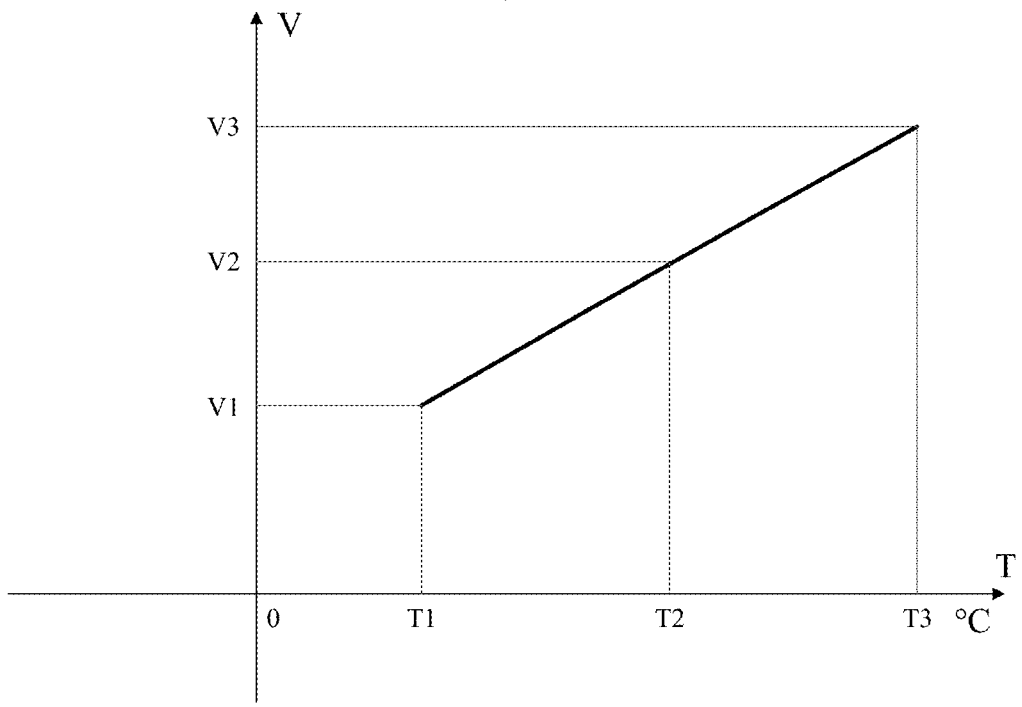
FIG. 4 is a schematic diagram of an output voltage curve of a circuit structure for realizing circuit pin multiplexing according to the present invention.

The circuit structure of the present invention adopts appropriate reference voltage and resistance value. The relationship between temperature and voltage is shown in FIG. 4, it can be seen that at a certain temperature, the output voltage no longer decreases with the temperature.

The circuit structure for realizing circuit pin multiplexing of the present invention realizes the mutual influence of analog signal output and digital signal transmission by designing a temperature sensing output curve, and achieves multi-function multiplexing of a single pin, so that the output of the analog signal and the input of the digital signal can share the pins, which not only solves the problem of the limitation of the number of pins, but also effectively promotes the transmission of the signal and improves the cost performance of the circuit.

In this specification, the present invention has been described with reference to specific embodiments thereof. However, it will be evident that various modifications and changes can still be made without departing from the spirit and scope of the present invention. Accordingly, the description and drawings should be regarded in an illustrative rather than a limited sense.

What is claimed is:

1. A circuit structure for realizing circuit pin multiplexing, comprising an MCU module, a temperature sensing circuit and a functional module circuit, wherein the output end of the temperature sensing circuit is connected with an enable signal interface of the MCU module, the output voltage of the temperature sensing circuit is always higher than the threshold voltage of the enable signal, and the MCU module is connected with the functional module circuit;

wherein the circuit structure further comprises an overcurrent-protection circuit and a temperature-protection circuit, the overcurrent-protection circuit and the temperature-protection circuit are both connected with the output end of the temperature sensing circuit, and the outputs of the overcurrent-protection circuit and the temperature-protection circuit are both set to be open-drain output mode.

2. The circuit structure according to claim 1, wherein the MCU module outputs a low-level signal, and transmits the low-level signal to the temperature sensing circuit.

3. The circuit structure according to claim 1, wherein the temperature sensing circuit comprises a reference circuit unit, an inverting amplifier circuit and a follower circuit, and the reference circuit unit outputs a reference voltage Vf1 signal and a reference voltage Vf2 signal, respectively;

the forward end of the inverting amplifier circuit is connected with the reference circuit unit, and the input of the forward end is the reference voltage Vf1; the reverse input signal of the inverting amplifier circuit is voltage Vpn, and the output signal of the inverting amplifier circuit is Vot;

the forward end of the follower circuit is connected with the reference circuit unit, and the input of the forward end is the reference voltage Vf2; the reverse end of the follower circuit is connected with the reference circuit unit; and the temperature sensing circuit further comprises a current source (If1) and a diode, the negative direction of the diode is grounded, the positive direction of the diode is connected with an end of the current source (If1), and the other end of the current source (If1) is grounded, the current source (If1) generates the voltage Vpn with a negative temperature characteristic through the diode, and the voltage Vpn is input to the reverse end of the inverting amplifier circuit.

4. The circuit structure according to claim 3, wherein the inverting amplifier circuit comprises a first operational amplifier (AMP1), a first resistor (R1), a second resistor (R2), a third resistor (Rf) and a current limiting resistor, wherein the forward end of the first operational amplifier (AMP1) is connected with an end of the first resistor (R1), and the third resistor (Rf) is set between the reverse end and the output end of the first operational amplifier (AMP1), and the other end of the first resistor (R1) is connected with the reference circuit, the output end of the first operational amplifier (AMP1) is connected with the current limiting resistor, and the second resistor (R2) is respectively connected with the reverse end of the first operational amplifier (AMP1) and the follower circuit.

5. The circuit structure according to claim 4, wherein the follower circuit comprises a second operational amplifier (AMP2) and a MOS transistor (P1), wherein the forward end of the second operational amplifier (AMP2) is connected with the reference circuit unit, the reverse end of the second operational amplifier (AMP2) is connected with the second resistor (R2), and the gate of the MOS transistor (P1) is connected with the output end of the second operational amplifier (AMP2), the source and the drain of the MOS transistor (P1) are respectively connected with both sides of the diode.

6. The circuit structure according to claim 3, wherein the diode refers to two series connected diodes.

7. The circuit structure according to claim 4, wherein the voltage Vpn with the negative temperature characteristic is input to the second resistor (R2).

8. The circuit structure according to claim 5, wherein the maximum value of the reverse input signal, which is the voltage Vpn, is clamped such that Vpn≤Vf2.

9. The circuit structure according to claim 5, wherein a value of the Vot is expressed as:

$$Vot = -Rf/R2 \times Vpn + (Rf/R2+1)Vf1,$$

wherein the (Rf/R2+1)Vf1 is a fixed value.

10. The circuit structure according to claim 8, wherein the Vot has a positive temperature characteristic.

11. The circuit structure according to claim 8, wherein the minimum value of the Vot is expressed as:

$$Vot,min = -Rf/R2 \times Vf2 + (Rf/R2+1)Vf1.$$

* * * * *